United States Patent
Nakajima (10) Patent No.: US 10,067,429 B2
(45) Date of Patent: Sep. 4, 2018

(54) PATTERN DRAWING APPARATUS AND PATTERN DRAWING METHOD

(71) Applicant: ADTEC Engineering Co., Ltd., Tokyo (JP)

(72) Inventor: Eriko Nakajima, Ebina (JP)

(73) Assignee: ADTEC Engineering Co., Ltd., Tokyo (JP)

( * ) Notice: Subject to any disclaimer, the term of this patent is extended or adjusted under 35 U.S.C. 154(b) by 0 days.

(21) Appl. No.: 15/231,842

(22) Filed: Aug. 9, 2016

(65) Prior Publication Data

US 2017/0343907 A1    Nov. 30, 2017

(30) Foreign Application Priority Data

May 26, 2016  (JP) ................................. 2016-104816

(51) Int. Cl.
G06K 9/00       (2006.01)
G03F 9/00       (2006.01)
G03F 7/20       (2006.01)

(52) U.S. Cl.
CPC .......... *G03F 9/7046* (2013.01); *G03F 7/2053* (2013.01)

(58) Field of Classification Search
CPC .......... G03F 7/20; G03F 7/201; G03F 7/2051; G03F 7/2053; G03F 7/704; G03F 7/70425; G03F 7/70433; G03F 7/70775; G03F 9/00; G03F 9/70; G03F 9/7003; G03F 9/7007; G03F 9/7011; G03F 9/7015; G03F 9/7019; G03F 9/7023; G03F 9/7042; G03F 9/7046; G03F 9/7065; G03F 9/7069; G03F 9/7073; G03F 9/7076; G03F 9/708; G03F 9/7084; G03F 9/7088; G03F 9/7092; G06T 7/30; G06T 7/70; G06K 5/00–5/04; G06K 9/32–9/3216; G06K 9/6203;
(Continued)

(56) References Cited

U.S. PATENT DOCUMENTS 5,805,866 A  *  9/1998  Magome ............. G03F 7/70858
                                                355/53
7,170,603 B2 *  1/2007  Katayama ........... G03F 7/70691
                                                355/77
(Continued)

FOREIGN PATENT DOCUMENTS

JP    2008-65034 A  *  3/2008  ............... G03F 7/20
JP    2008-65034 A     3/2008

*Primary Examiner* — Jose Couso
(74) *Attorney, Agent, or Firm* — Crowell & Moring LLP (57) ABSTRACT

A pattern drawing apparatus includes a first image-pickup device for reading an alignment mark and reading a first pattern image for detecting a positional shift, a second image-pickup device for reading the first pattern image and reading a second pattern image for detecting a positional shift drawn by an irradiation light beam from the optical head while carrying out a relative movement between the table and the optical head, and a positional shift detection unit for obtaining a first coordinate difference between a center of a visual field of the first image-pickup device and a center of the first pattern based on a read image by the first image-pickup device and obtaining a second coordinate difference between the center of the first pattern and a specific position of the second pattern based on a read image by the second image-pickup device.

6 Claims, 11 Drawing Sheets

(58) Field of Classification Search
CPC ....... G06K 15/1219; G06K 2009/3225; G01B 11/00; G01B 11/002; G01B 11/26; G01B 11/27
See application file for complete search history.

(56) References Cited

U.S. PATENT DOCUMENTS

| | | | |
|---|---|---|---|
| 7,256,869 B2* | 8/2007 | Nishi | G03F 7/70216 355/53 |
| 7,298,482 B2* | 11/2007 | Yamamoto | G01B 11/272 250/548 |
| 8,274,642 B2* | 9/2012 | Matsuura | G03F 7/70791 355/53 |
| 8,442,270 B2* | 5/2013 | Yanai | G06K 9/468 382/103 |
| 8,886,350 B2* | 11/2014 | Yamada | G03F 7/70291 700/105 |
| 9,057,873 B2* | 6/2015 | Miyamoto | G03F 9/7003 |
| 9,136,089 B2* | 9/2015 | Wang | H01J 37/222 |
| 9,904,179 B2* | 2/2018 | Koizumi | G03F 7/70433 |
| 9,910,361 B2* | 3/2018 | Shibazaki | G03F 7/70108 |
| 9,915,878 B2* | 3/2018 | Shibazaki | G03F 7/70583 |
| 2004/0189995 A1* | 9/2004 | Tanaka | G03F 9/7003 356/401 |
| 2008/0013089 A1* | 1/2008 | Ishii | G03F 9/7011 356/400 |
| 2014/0049759 A1* | 2/2014 | Shibazaki | G03F 7/70725 355/30 |
| 2017/0261317 A1* | 9/2017 | Lee | G01B 11/002 |
| 2018/0054932 A1* | 2/2018 | Amano | H05K 13/08 |

* cited by examiner

COORDINATE
DIFFERENCES
(ΔX2、ΔY2)

PATTERN DRAWING APPARATUS AND PATTERN DRAWING METHOD

CROSS-REFERENCE TO RELATED APPLICATION

The present application claims priority from Japanese Patent Application No. 2016-104816 filed on May 26, 2016, the content of which is hereby incorporated by reference into this application.

TECHNICAL FIELD OF THE INVENTION

The present invention relates to a pattern drawing apparatus that draws a wiring pattern or the like by irradiating a photosensitive material on a substrate serving as a workpiece mounted on a worktable with the laser beam from optical heads, and a pattern drawing method.

BACKGROUND OF THE INVENTION

In the pattern drawing apparatus of this type, by taking it into consideration that a positional relationship among components becomes different from designed values at an actual drawing stage, normally, corresponding positional shifts are preliminarily detected, so that the drawing positions are corrected.

For example, Japanese Patent Application Laid-Open Publication No. 2008-65034 (Patent Document 1) has disclosed a pattern drawing apparatus designed such that, by respectively detecting a positional shift between a camera for reading an alignment mark (hereinafter, referred to simply as "AM") which is formed on a substrate and serves as a reference for adjusting a position and a calibration pattern for positional shift detection, and a positional shift between a pulse light beam of the optical head and the calibration pattern, a positional shift between the AM camera and the optical head relative to designed values can be detected.

The positional shift detecting operations are desirably carried out in a state close to an actual drawing operation; if not so, even a difference in detection timing would cause a positional shift. More specifically, a time lag between an operation of relatively moving the worktable with respect to the optical head and irradiation timing in the laser irradiation system causes a positional shift. In a case in which a pattern drawing process with higher accuracy is required, this positional shift cannot be ignored; however, the positional shift detection system according to Patent Document 1 completely fails to take this problem into consideration.

SUMMARY OF THE INVENTION

Accordingly, in a pattern drawing system for controlling a relative amount of movement between a table on which a workpiece is mounted and an optical head based on a reading position of the alignment mark serving as a reference of drawing positions formed on the workpiece, an object of the present invention is to detect positional shifts relative to designed values with high accuracy.

Of the inventions disclosed in the present application, one of the representative pattern drawing apparatus which includes an optical head, controls a relative amount of movement between a table on which a workpiece is mounted and the optical head based on a reading position of an alignment mark serving as a reference of drawing positions formed on the workpiece, and allows the optical head to draw a pattern on the workpiece, further including: a first image-pickup unit for reading the alignment mark and reading an image of a first pattern for detecting a positional shift; a second image-pickup unit for reading the image of the first pattern and reading an image of a second pattern for detecting a positional shift drawn by an irradiation light beam from the optical head while carrying out a relative movement between the table and the optical head; and a positional shift detection unit for obtaining a first coordinate difference between a center of a visual field of the first image-pickup unit and a center of the first pattern based on a read image by the first image-pickup unit and obtaining a second coordinate difference between the center of the first pattern and a specific position of the second pattern based on a read image by the second image-pickup unit.

Also, of the inventions disclosed in the present application, one of the representative pattern drawing method including the steps of controlling a relative amount of movement between a table on which a workpiece is mounted and an optical head based on a reading position of an alignment mark serving as a reference of drawing positions formed on the workpiece, and allowing the optical head to draw a pattern on the workpiece, further including: a first step of obtaining a first coordinate difference between a center of a visual field of a first image-pickup unit and a center of a first pattern by reading an image of the first pattern for detecting a positional shift by using the first image-pickup unit for reading the alignment mark; a second step of drawing a second pattern for detecting a positional shift by using an irradiation light beam from the optical head while carrying out a relative movement between the table and the optical head; and a third step of obtaining a second coordinate difference between the center of the first pattern and a specific position of the second pattern based on the first pattern and a read image by a second image-pickup unit for reading an image of the second pattern.

In accordance with the present invention, in the pattern drawing system for controlling a relative amount of movement between a table on which the workpiece is mounted and the optical head based on a reading position of the alignment mark serving as a reference of drawing positions formed on the workpiece, it becomes possible to detect positional shifts relative to designed values with high accuracy.

DESCRIPTIONS OF THE PREFERRED EMBODIMENTS

[Embodiment]

In the following, an embodiment of the present invention will be described with reference to FIG. 1 to FIG. 8.

Figure 2:
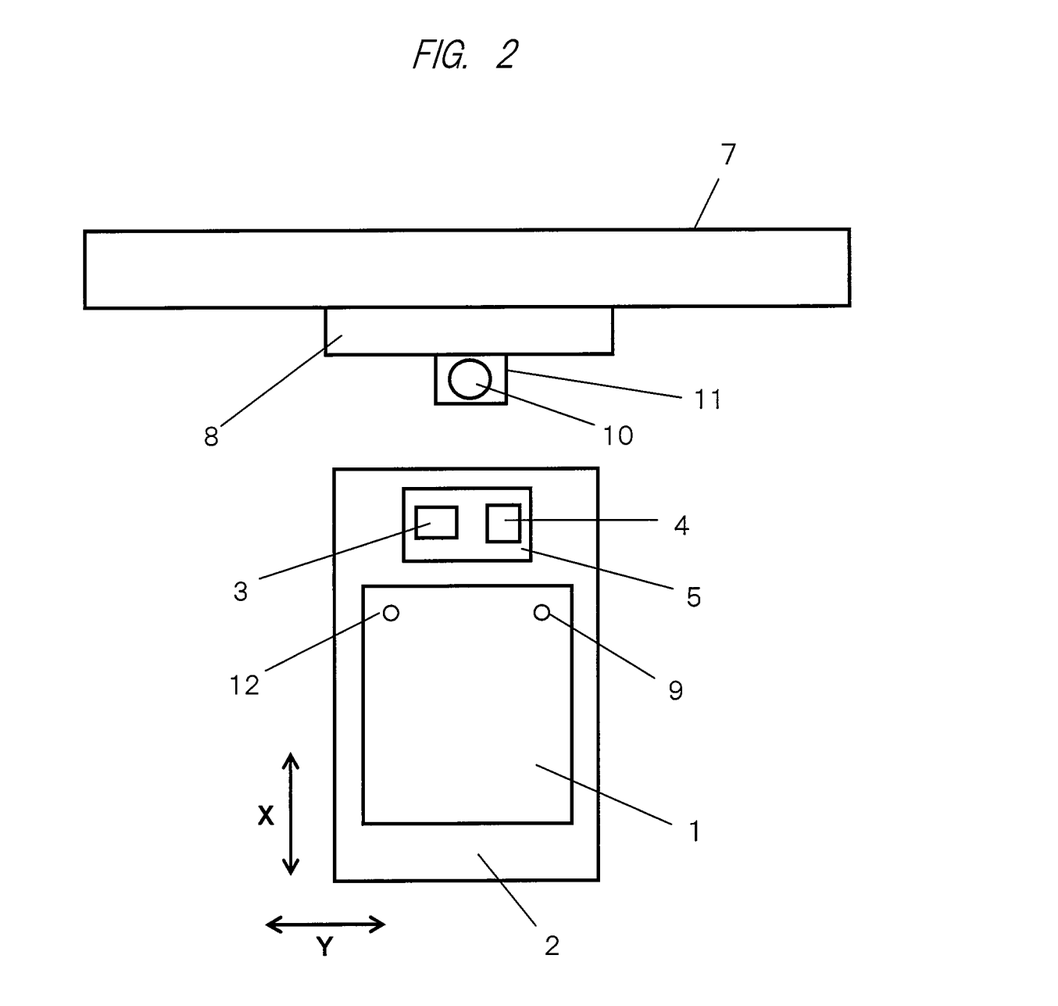
FIG. 2 is a schematic plan view showing a pattern drawing apparatus in accordance with an embodiment of the present invention.

FIG. 2 is a schematic plan view showing a pattern drawing apparatus as one embodiment of the present invention. In FIG. 2, reference numeral 1 represents a substrate serving as a workpiece on which a pattern drawing process is carried out and mounted on a worktable 2 capable of moving in an X direction and a Y direction. Onto the worktable 2, an optical head camera holding table 5 on which an optical head camera 3 and an optical unit 4 are mounted is attached, and these are allowed to pass through below a gate 7 having a substantially U-shape by the movement of the worktable 2 in the X direction.

On the front side of the gate 7, an optical head unit 8 including a plurality of optical heads is attached and is designed to carry out a drawing process of a desired pattern by irradiating the substrate 1 that relatively moves with respect to the optical head unit 8 with the laser light beam. To this optical head unit 8, an AM camera 10 of a coaxial illumination type for reading the AM 9 formed on the substrate 1 is attached through an attaching member 11.

Each of the optical heads of the optical head unit 8 is formed by using a digital micromirror device (DMD) in which movable micromirrors are arranged in a matrix form, and the tilt of each of the movable micromirrors is controlled by an on/off signal from control means. The optical head of this type has been known by, for example, Japanese Patent Application Laid-Open Publication No. 2009-80324.

Figure 3:
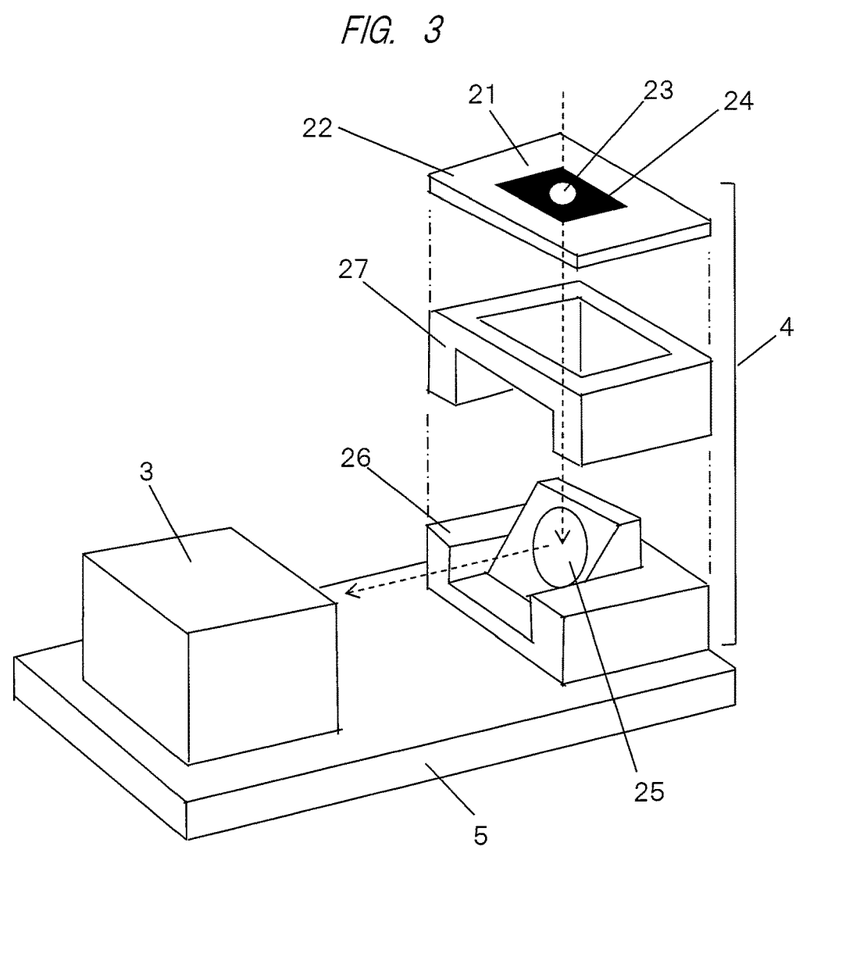
FIG. 3 is a view for illustrating a structure of an upper portion of an optical head camera holding table in accordance with the embodiment of the present invention.
Figure 4:
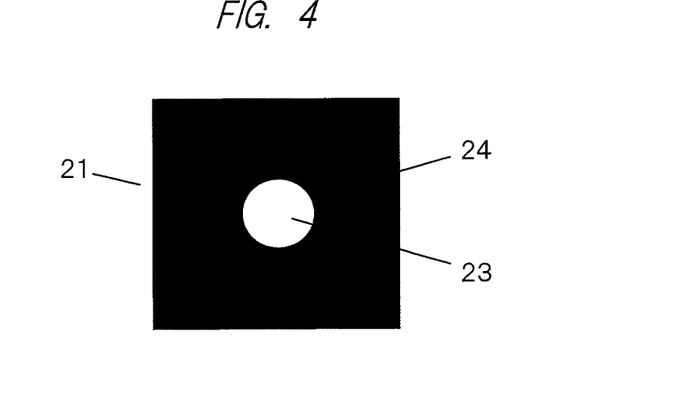
FIG. 4 is a view showing a calibration pattern in accordance with the embodiment of the present invention.

FIG. 3 is a view for illustrating the structure of the upper portion of the optical head camera holding table 5. In FIG. 3, a calibration pattern formation plate 22 having a calibration pattern 21 formed thereon is disposed on the uppermost portion of the optical unit 4 mounted on the optical head camera holding table 5. The calibration pattern formation plate 22 is a translucent flat plate member, and as shown in FIG. 4, the calibration pattern 21 is constituted by a quadrangular light shielding section 24 with a circular transmission section 23 remaining in the central portion. In this calibration pattern 21, the center of the transmission section 23 is regarded as the center of the calibration pattern 21.

Below the calibration pattern formation plate 22, a base 26 for holding a reflection mirror 25 for reflecting light transmitted through the transmission section 23 and a cylindrical spacer 27 for attaching the calibration pattern formation plate 22 to the base 26 with a predetermined interval are disposed. The optical head camera 3 is disposed at such a position as to receive light from the reflection mirror 25.

Note that, although the size of the transmission section 23 is relatively considerably small to the light shielding section 24, it is illustrated with a larger size so as to make it easy to see in FIG. 3 and FIG. 4.

Figure 5:
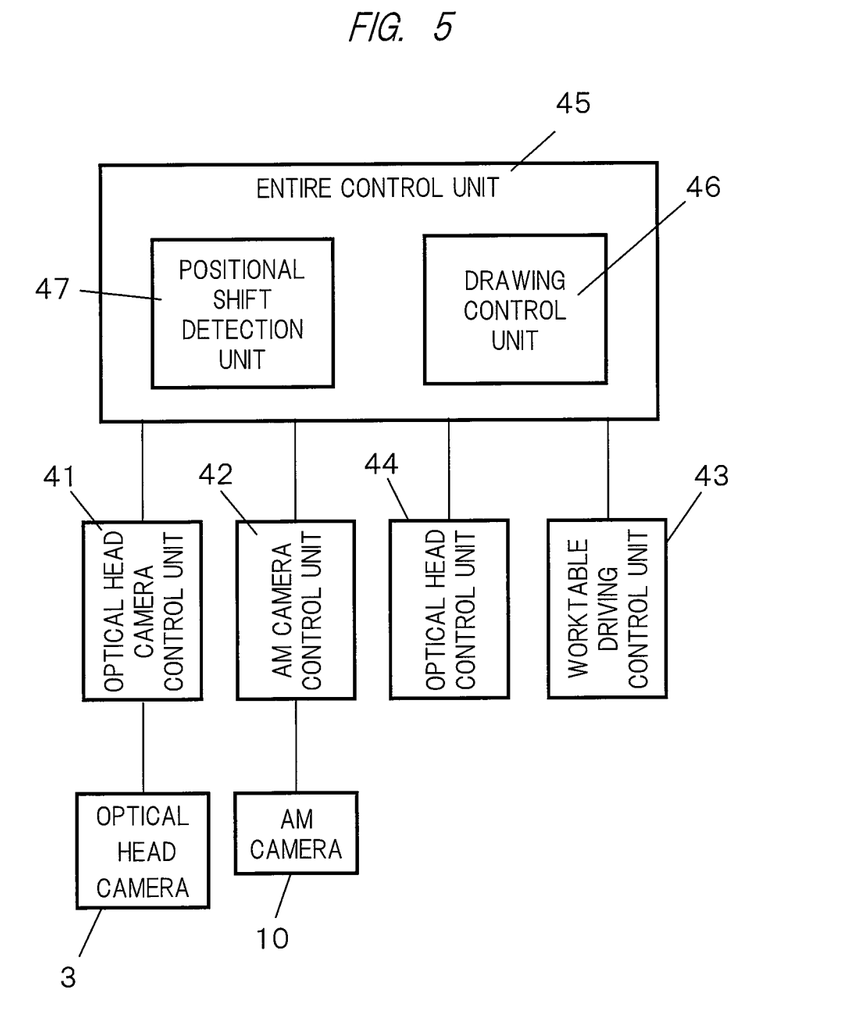
FIG. 5 is a block diagram for illustrating a control system of the pattern drawing apparatus in accordance with the embodiment of the present invention.

FIG. 5 is a block diagram for illustrating the control system of the pattern drawing apparatus. In FIG. 5, reference numeral 41 represents an optical head camera control unit for controlling reading operations of the optical head camera 3, reference numeral 42 represents an AM camera control unit for controlling reading operations of the AM camera 10, reference numeral 43 represents a worktable driving control unit for controlling movements of the worktable 2 in the X direction and the Y direction, and reference numeral 44 represents an optical head control unit for controlling operations of the respective optical heads of the optical head unit 8, the optical head control unit generating an on/off signal for controlling the tilt of each of the movable micro mirrors located inside the DMD of each of the optical heads. Reference numeral 45 represents an entire control unit for controlling operations of the entire apparatus.

The entire control unit 45 includes a drawing control unit 46 which stores image information of patterns to be drawn in storage means, and controls the worktable driving control unit 43 and the optical head control unit 44 so as to draw a desired pattern on the substrate 1 and a positional shift detection unit 47 for detecting a positional shift in accordance with the present invention.

The entire control unit 45 may be realized by, for example, a processing device controlled by a program, and among functional elements provided outside the entire control unit 45, one portion or the entire portions thereof except for the optical head camera 3 and the AM camera 10 may be executed inside the entire control unit 45.

Note that, in FIG. 5, with respect to the components and connection lines, only those considered to be required for describing the present embodiment are illustrated, and all of those components required as the pattern drawing apparatus are not necessarily illustrated.

In this pattern drawing apparatus, in a case in which a desired pattern is actually drawn on the substrate 1, the following operations are carried out under control of the entire control unit 45.

In FIG. 2, by moving the worktable 2 in the X direction and/or Y direction, the worktable 2 is aligned so that the AM 9 formed on the substrate 1 can be read by the AM camera 10. Thereafter, based on the detection position of the AM 9 thus read out, while the worktable 2 is being moved in the X direction and/or Y direction in accordance with drawing information including positional information, irradiation light is applied to the substrate 1 from the optical head of the optical head unit 8, and the desired pattern is drawn.

Figure 10:
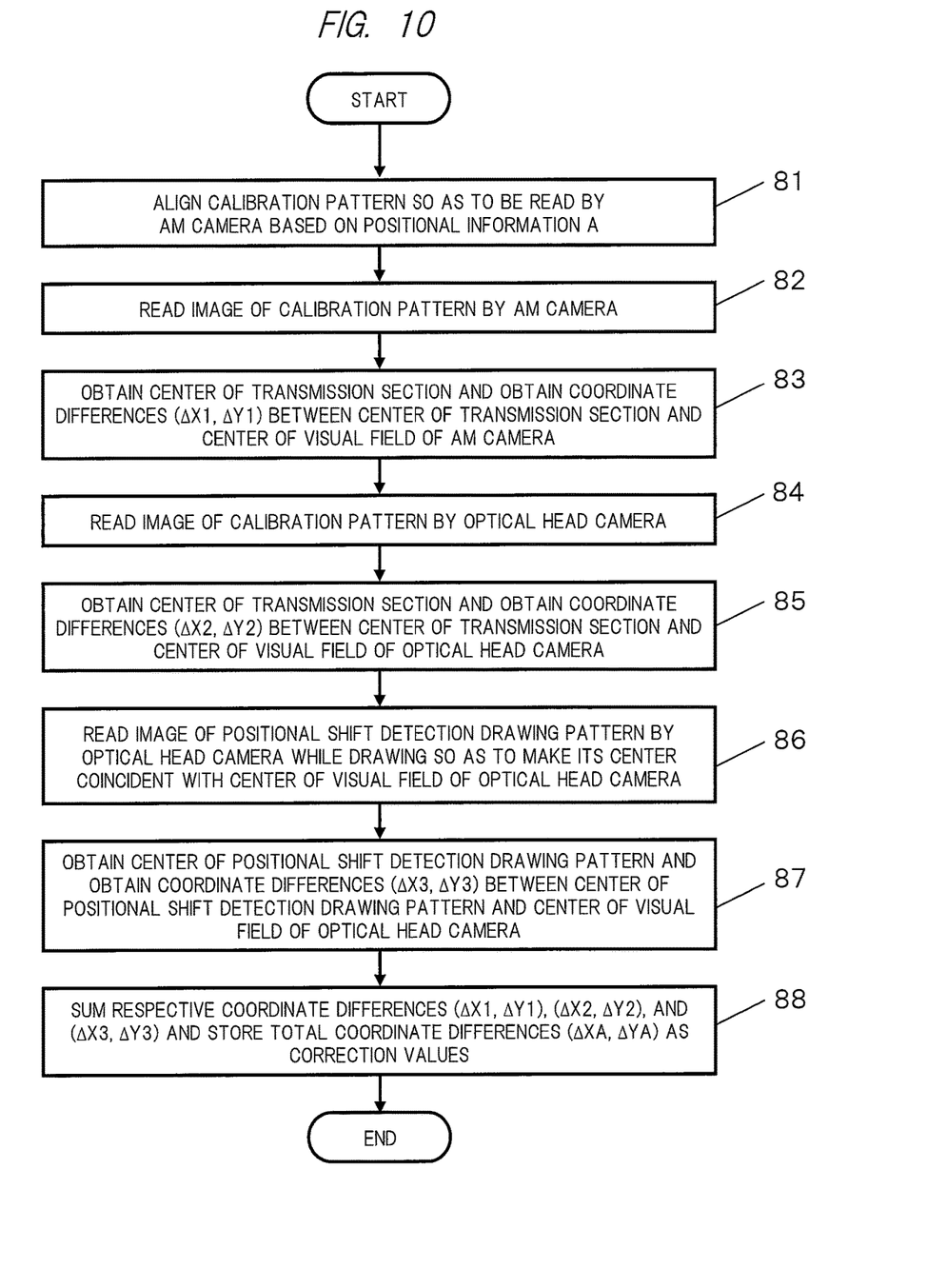
FIG. 10 is a flow chart for illustrating operations in the embodiment of the present invention.

Moreover, in a case in which a positional shift detecting operation is executed, the following operations are carried out under control of the entire control unit 45. FIG. 10 is a flowchart showing the positional shift detecting operation.

In FIG. 2 and FIG. 3, first, based on positional information A to be described later, by moving the worktable 2 in the X direction and the Y direction, the worktable 2 is aligned so that the calibration pattern 21 on the optical unit 4 can be read by the AM camera 10 (step 81 in the flow chart of FIG.

10; hereinafter, only the step number is described), and thereafter, the calibration pattern 21 is read by the AM camera 10 (step 82).

Figure 6:
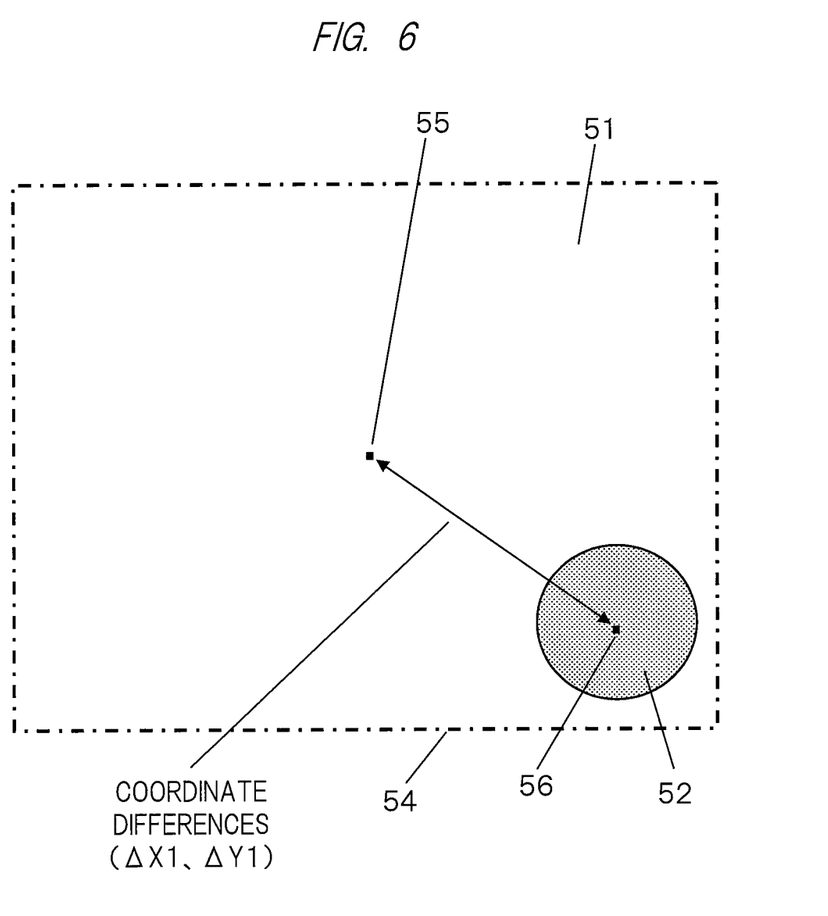
FIG. 6 is a view for illustrating a read image of an AM camera in accordance with the embodiment of the present invention.

FIG. 6 is a view for illustrating a read image by the AM camera 10 at this time. In FIG. 6, reference numeral 51 represents a calibration pattern, reference numeral 52 represents a transmission section of the calibration pattern 51, reference numeral 54 represents a visual field of the AM camera 10, reference numeral 55 represents the center of the visual field 54, and reference numeral 56 represents the center of the transmission section 52. In the calibration pattern 51, the transmission section 52 only looks dim, and the peripheral portion thereof looks bright.

Based on the read image of the AM camera 10, the positional shift detection unit 47 in FIG. 5 obtains the center 56 of the transmission section 52 by using, for example, a method for obtaining the center of the area and further obtains coordinate differences ($\Delta X1$, $\Delta Y1$) between the center 56 of the transmission section 52 and the center 55 of the visual field 54 of the AM camera 10 ($\Delta X1$ is a coordinate difference in the X direction, $\Delta Y1$ is a coordinate difference in the Y direction, and hereinafter, denoted in the same manner) (step 83). Note that, in this case, it is supposed that the center 55 is preliminarily obtained as a position having ½ of each of the numbers of the longitudinal and lateral pixels of the visual field of the AM camera 10.

Note that, the above-mentioned positional information A is positional information used when alignment is made in such a way that the center 55 of the visual field 54 of the AM camera 10 is mutually coincident with the center 56 of the transmission section 52 serving as the center of the calibration pattern 51 based on the designed values.

Next, the calibration pattern 21 is read by the optical head camera 3 with the alignment made based on the above-mentioned positional information A (step 84).

Figure 7:
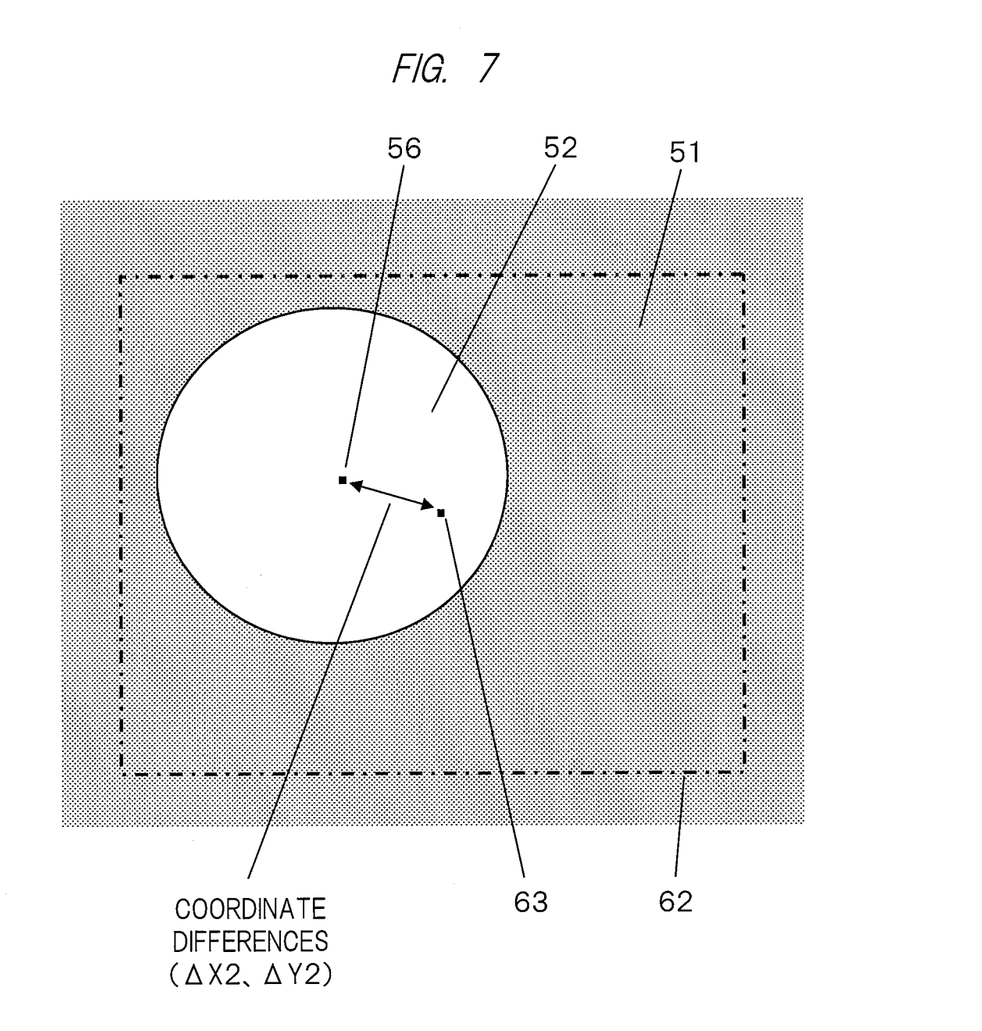
FIG. 7 is a view for illustrating a read image of an optical head camera in accordance with the embodiment of the present invention.

FIG. 7 is a view for illustrating the read image of the optical head camera 3 at this time. In FIG. 7, reference numeral 51 represents a calibration pattern, reference numeral 52 represents a transmission section of the calibration pattern 51, reference numeral 56 represents the center of the transmission section 52, reference numeral 62 represents a visual field of the optical head camera 3, and reference numeral 63 represents the center of the visual field 62. The transmission section 52 shines brightly, and the peripheral portion looks dark.

Based on the read image of the optical head camera 3, the positional shift detection unit 47 in FIG. 5 detects the center 56 of the transmission section 52 by using, for example, a method for obtaining the center of its area and further obtains coordinate differences ($\Delta X2$, $\Delta Y2$) between the center 56 of the transmission section 52 and the center 63 of the visual field 62 of the optical head camera 3 (step 85). Note that, in this case, it is supposed that the center 63 of the visual field 62 is preliminarily obtained as a position having ½ of each of the numbers of the longitudinal and lateral pixels of the visual field of the optical head camera 3.

Figure 8:
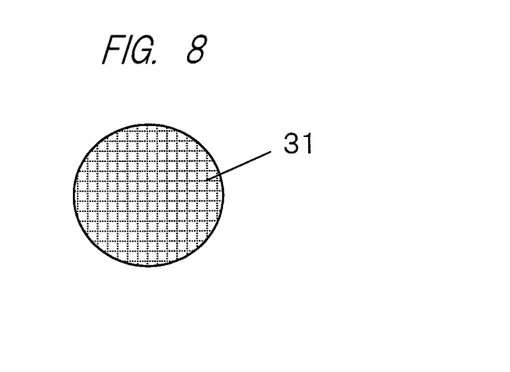
FIG. 8 is a view showing a drawing pattern for positional shift detection in accordance with the embodiment of the present invention.

Next, by using a method to be described later, while a circular pattern 31 (hereinafter, referred to as a positional shift detection drawing pattern) as shown in FIG. 8 is being drawn in the visual field of the optical head camera 3, the resulting image is read by the optical head camera 3 (step 86). Note that, in FIG. 8, a meshed portion corresponds to the drawing region.

Figure 9:
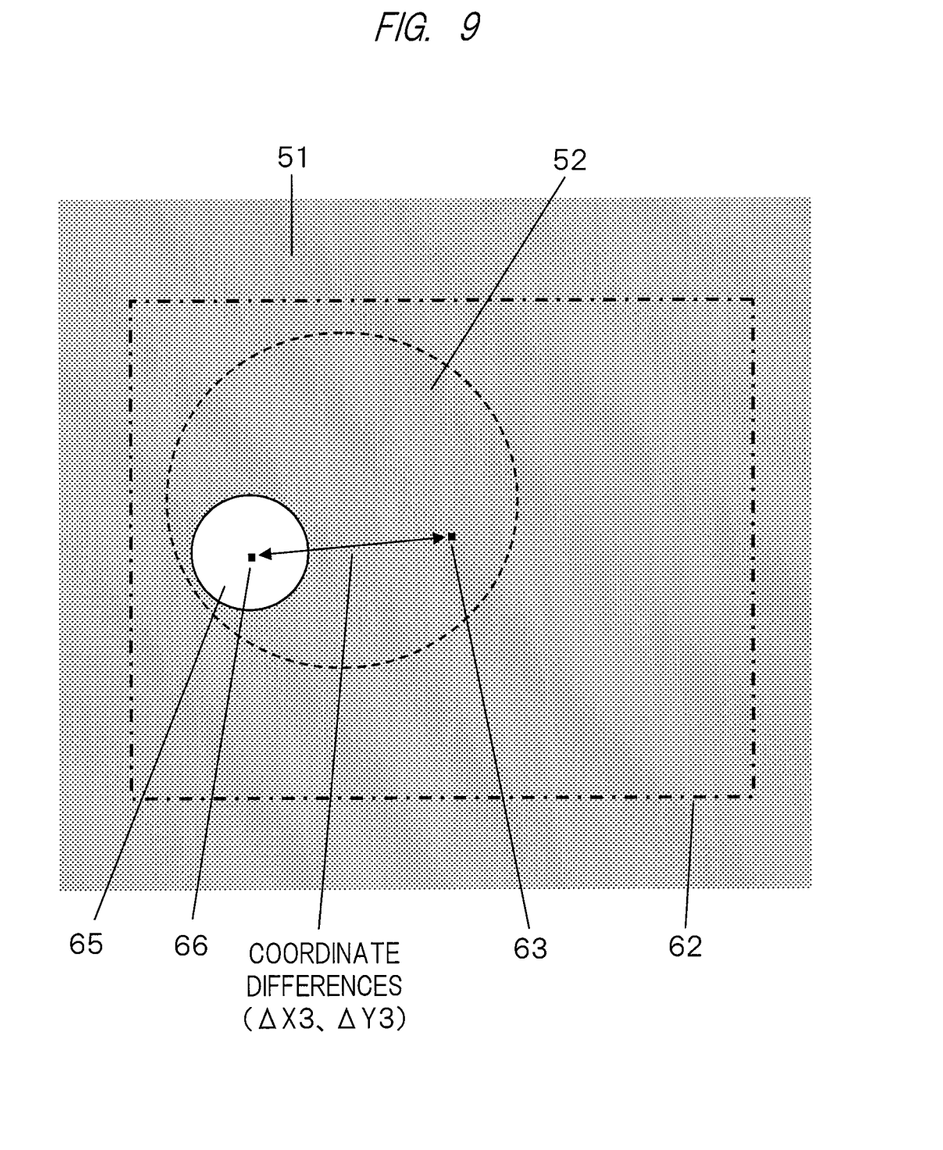
FIG. 9 is a view for illustrating a read image of the optical head camera obtained at a point of time different from that shown in FIG. 7 in accordance with the embodiment of the present invention.

FIG. 9 is a view for illustrating a read image of the optical head camera 3 at this time. In FIG. 9, reference numeral 65 represents a positional shift detection drawing pattern that has been drawn, and the positional shift detection drawing pattern 65 is bright. In contrast, the calibration pattern 51, which is illustrated with the transmission section 52 included therein, is dark and cannot be recognized. The reference numeral 62 corresponds to the visual field of the optical head camera 3, and the reference numeral 63 corresponds to the center of the visual field 62.

Based on the read image of the optical head camera 3, the positional shift detection unit 47 in FIG. 5 detects the center 66 of the positional shift detection drawing pattern 65 by using, for example, a method for obtaining the center of its area and further obtains coordinate differences ($\Delta X3$, $\Delta Y3$) between the center 66 of the positional shift detection drawing pattern 65 and the center 63 of the visual field 62 of the optical head camera 3 (step 87). Note that, in this case, it is supposed that the center 63 of the visual field 62 is preliminarily obtained as a position having ½ of each of the numbers of the longitudinal and lateral pixels of the visual field of the optical head camera 3.

Note that the drawing process of the positional shift detection drawing pattern 31 shown in FIG. 8 is carried out in the following manner.

Based on the designed values, in the same manner as in a normal drawing operation, while the worktable 2 is being moved within the visual field of the optical head camera 3, the drawing process is carried out by operating movable micromirrors selected in the DMD in an optical head which has been designed so as to form a reference of the drawing position among the plural optical heads included in the optical head unit 8, for example, an optical head located at the end when the optical head unit 8 is seen in the Y direction (hereinafter, referred to as a reference optical head). In this case, the drawing process is carried out so as to make the center of the positional shift detection drawing pattern 31 coincident with the center of the visual field of the optical head camera 3.

In this case, for example, the center of image information of the positional shift detection drawing pattern 31 is preliminarily determined as a specific position, and then, the information is written in the storage means in the drawing control unit 46. The drawing control unit 46 develops the image information in the storage means from the coordinate system in the storage means to the coordinate system in the worktable 2 in the same manner as in the case of a normal drawing operation, so as to make its center coincident with the center of the visual field 62 of the optical head camera 3.

Note that, in this case, even when there is a large positional shift relative to the designed value, in order to prevent the positional shift detection drawing pattern 65 from being out of the visual field of the optical head camera 3 in FIG. 9, the sizes of the positional shift detection drawing pattern 31 and the visual field of the optical head camera 3 need to be set so as to provide sufficient margins.

Lastly, the positional shift detection unit 47 in FIG. 5 sums the respective coordinate differences ($\Delta X1$, $\Delta Y1$), ($\Delta X2$, $\Delta Y2$), and ($\Delta X3$, $\Delta Y3$) thus obtained and stores the total coordinate differences ($\Delta XA$, $\Delta YA$) as correction values (step 88). Mutual relationships among the respective coordinate differences ($\Delta X1$, $\Delta Y1$), ($\Delta X2$, $\Delta Y2$), ($\Delta X3$, $\Delta Y3$), and ($\Delta XA$, $\Delta YA$) are shown in FIG. 1.

Figure 1:
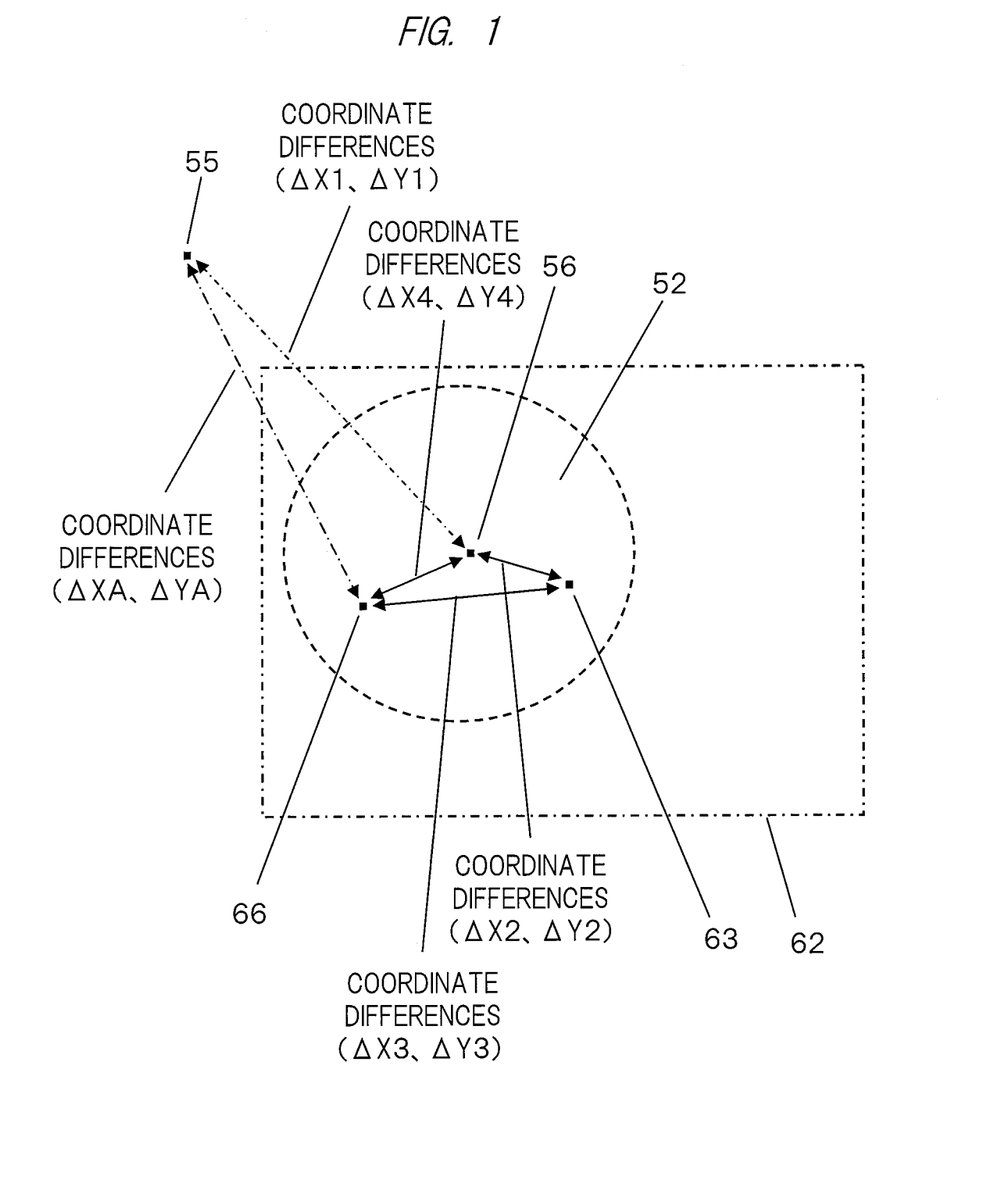
FIG. 1 is a view for illustrating the detection of positional shifts in the present invention.

In a case in which a desired pattern is actually drawn on the substrate 1 by supplying drawing information including positional information, the AM detection position detected by the AM camera 10 is used as a reference; however, FIG. 1 shows that, when the desired pattern is actually drawn, a positional shift of (ΔXA, ΔYA) undesirably occurs between the position determined by the designed values and the position actually drawn.

Now, returning to a case in which the desired pattern is actually drawn on the substrate 1, based on the detection position of the AM 9, the drawing control unit 46 of the entire control unit 45 in FIG. 5 controls movements of the worktable 2 in the X direction and the Y direction in accordance with the drawing information including positional information. In this case, by using the coordinate differences (ΔXA, ΔYA) stored in the positional shift detection unit 47 as correction values, a target position of movement of the worktable 2 is corrected. Thus, a desired pattern can be drawn at an originally desired position.

In accordance with the above-mentioned embodiment, at the time of the positional shift detecting operation, the optical head is allowed to draw a positional shift detection drawing pattern in an actual drawing mode, and the positional shift is detected by using the read image of this positional shift detection drawing pattern; thus, shifts including a positional shift derived from a time lag between a relative moving operation of the worktable 2 with respect to the optical head and irradiation timing in the laser irradiation system can be detected, so that it is possible to improve detection accuracy of the positional shift with respect to the designed value.

Moreover, since the size (diameter) of the positional shift detection drawing pattern 31 shown in FIG. 8 can be adjusted on demand, the center of the read image serving as a specific position can be easily detected, and also from this point of view, it is possible to improve the detection accuracy of the positional shift.

The above description has been given of the present invention mainly based on one embodiment; however, the embodiment is merely an example so as to make the present invention easily understood, and various modifications may be made therein by replacing various components or the like in the embodiment or by adding different elements thereto, and the present invention is not intended to be limited by the embodiment.

For example, in the above-mentioned embodiment, the calibration pattern 21 is first read by the AM camera 10, and the calibration pattern 21 and the positional shift detection drawing pattern are next read by the optical head camera 3; however, these may be carried out in the reversed manner.

Moreover, in the above-mentioned embodiment, the positional shift detection unit 47 obtains the coordinate differences (ΔXA, ΔYA) serving as the summed values of three coordinate differences to store as correction values; however, the positional shift detection unit 47 may obtain the respective coordinate differences (ΔX1, ΔY1), (ΔX2, ΔY2), and (ΔX3, ΔY3) and may only store them respectively, and the drawing control unit 46 may be designed to obtain the summed values at the time of correction.

Figure 11A:
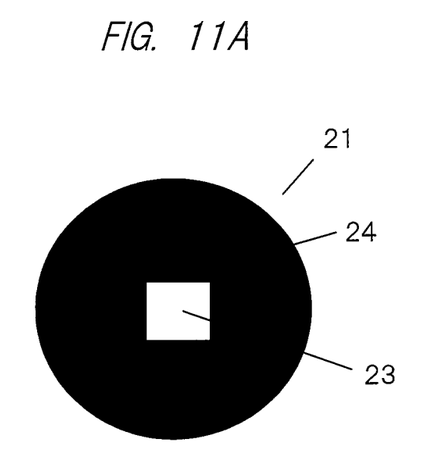
FIG. 11A is a view showing another example of the calibration pattern in the present invention.
Figure 11B:
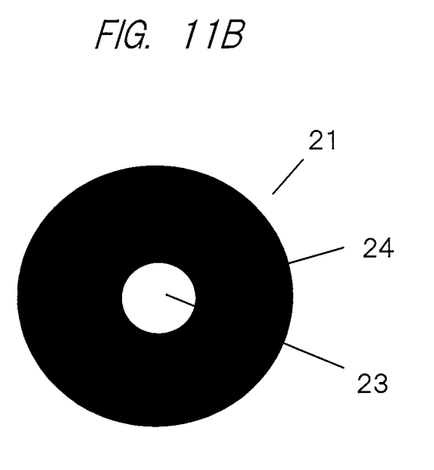
FIG. 11B is a view showing another example of the calibration pattern in the present invention.
Figure 11C:
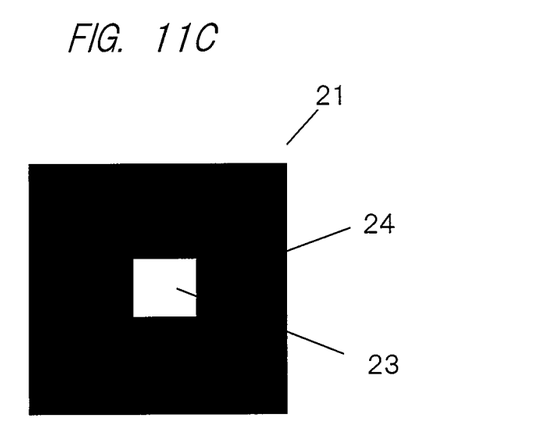
FIG. 11C is a view showing another example of the calibration pattern in the present invention.

Furthermore, in the above-mentioned embodiment, the calibration pattern 21 to be formed on the calibration pattern formation plate 22 is constituted by the quadrangular light shielding section 24 with the circular transmission section 23 remaining in the center; however, other shapes may be used as long as the center coordinates are obtained by processing the read images of the calibration patterns by the optical head camera 3 and the AM camera 10. For example, as shown in FIG. 11A, FIG. 11B, and FIG. 11C, the transmission section 23 and the light shielding section 24 may be formed into a quadrangular shape or a circular shape.

Furthermore, in the above-mentioned embodiment, in FIG. 9, the positional shift detection drawing pattern 65 is drawn so as to make its center 66 coincident with the center of the visual field 62 of the optical head camera 3.

However, the drawing process may be carried out in such a way that the center 66 of the positional shift detection drawing pattern 65 is located at a position shifted from the center of the visual field 62 of the optical head camera 3, for example, by (ΔXp, ΔYp) based on the designed value.

In this case, since the coordinate differences (ΔXA, ΔYA) detected by the above-mentioned method include portions corresponding to the above-mentioned shifts (ΔXp, ΔYp), the positional shift detection unit 47 calculates (ΔX1, ΔY1)+(ΔX2, ΔY2)+(ΔX3, ΔY3)−(ΔXp, ΔYp) and stores the resulting coordinate differences (ΔXB, ΔYB) as correction values, or the drawing control unit 46 may carry out the above-mentioned calculations at the time of correction.

Moreover, in the above-mentioned embodiment, the positional shift detection drawing pattern is drawn by operating movable micromirrors selected in the DMD in the reference optical head. However, since the positions of the movable micromirrors in the optical heads other than the reference optical head can be recognized based on the position of the reference optical head as a reference, the positional shift detection drawing pattern may be drawn by using selected movable micromirrors in the optical head other than the reference optical head.

Furthermore, in the above-mentioned embodiment, the positional shift detection drawing pattern to be drawn by the reference optical head is formed into a circular shape. However, it is not necessarily formed into a circular shape, and another shape may be used as long as the specific position of the positional shift detection drawing pattern can be obtained by processing the read image. For example, the shape may be formed into a quadrangular shape, and the corner portion located on the lower left side of the four corner portions may be set to the specific position.

Also, in the above-mentioned embodiment, based on the read image of the optical head camera 3, the coordinate differences (ΔX2, ΔY2) between the center 63 of the visual field 62 of the optical head camera 3 and the center 56 of the transmission section 52 and the coordinate differences (ΔX3, ΔY3) between the center 63 of the visual field 62 of the optical head camera 3 and the center 66 of the positional shift detection drawing pattern 65 are individually obtained.

However, in a case in which the summed values of the coordinate differences (ΔX2, ΔY2) and (ΔX3, ΔY3), that is, coordinate differences (ΔX4, ΔY4), can be detected at one time as shown in FIG. 1, it is not necessary to individually obtain the coordinate differences (ΔX2, ΔY2) and (ΔX3, ΔY3) corresponding to the components of the coordinate differences (ΔX4, ΔY4) as described above.

Figure 12:
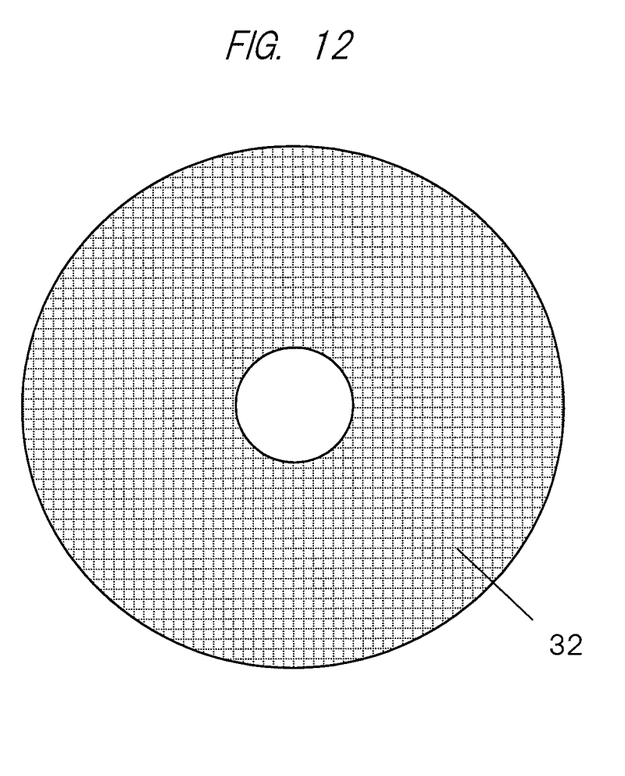
FIG. 12 is a view showing another example of the positional shift detection drawing pattern of the present invention.

The coordinate differences (ΔX4, ΔY4) can be obtained at one time, for example, in the following manner. As the positional shift detection drawing pattern 32 for use therein, a ring-shaped pattern is used as shown in FIG. 12. Note that a meshed portion in FIG. 12 corresponds to a drawing region.

Figure 13:
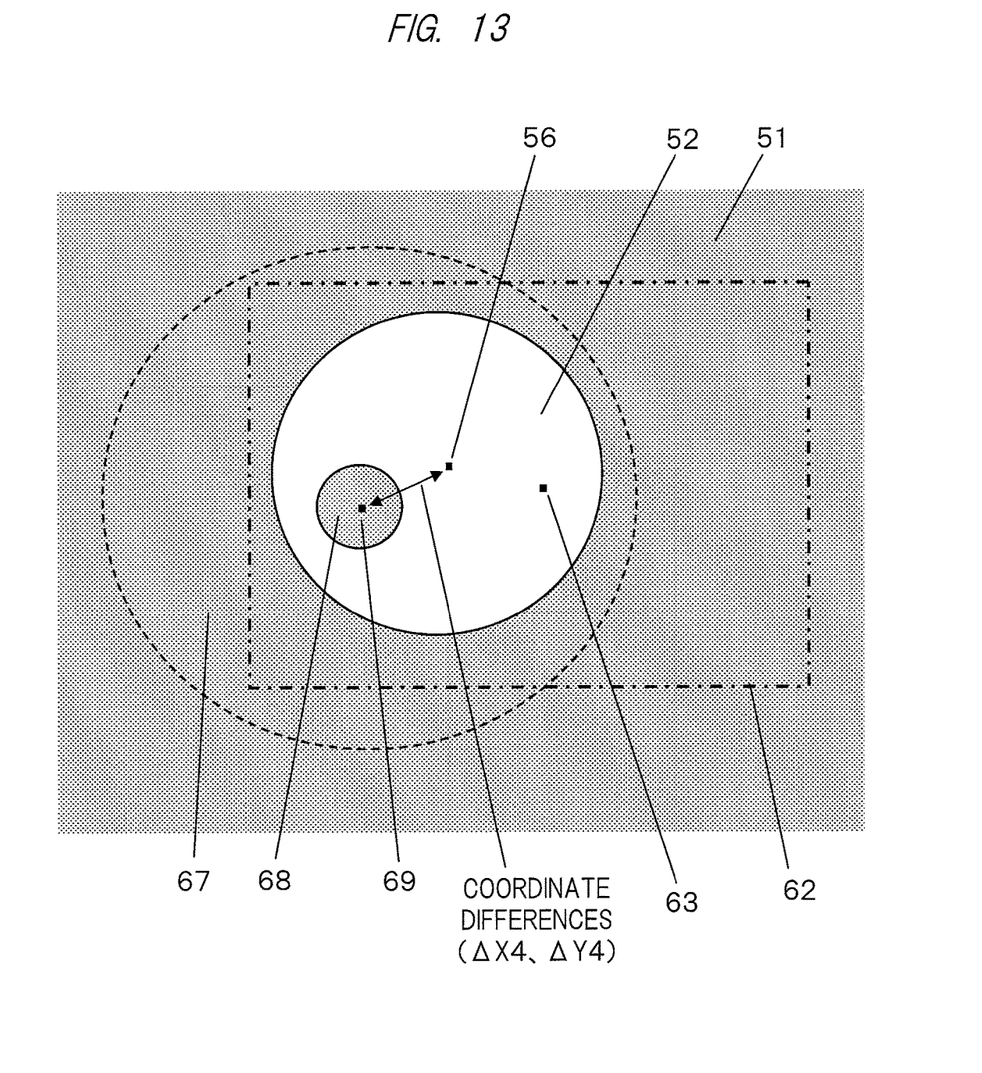
FIG. 13 is a view for illustrating a read image of the optical head camera corresponding to that of FIG. 9 in a case in which the positional shift detection drawing pattern shown in FIG. 12 is used.

FIG. 13 is a view for illustrating the read image of the optical head camera 3 corresponding to that of the above-mentioned FIG. 9 in a case in which the positional shift detection drawing pattern 32 of FIG. 12 is used. In FIG. 13, reference numeral 67 represents a positional shift detection drawing pattern drawn by the reference optical head, and in the transmission section 52, an inside portion 68 of the ring that is dark and the remaining portion that is bright can be recognized; however, the other portions are dark and cannot be recognized.

Note that, in this case, it is necessary to set the inner diameter and the outer diameter of the ring of the positional shift detection drawing pattern 67 and the size of the transmission section so as to provide sufficient margins, in order to prevent the inside portion 68 of the ring of the positional shift detection drawing pattern 67 from protruding from the transmission section 52, and the transmission section 52 from protruding into the outside portion of the ring of the positional shift detection drawing pattern 67, even in a case in which there is a large positional shift with respect to the designed value.

In a case in which the positional shift detection drawing pattern 32 of FIG. 12 is used, based on the read image of the optical head camera 3, the positional shift detection unit 47 in FIG. 5 obtains the center 56 of the transmission section 52 by using, for example, a method for obtaining the center of the area, further detects the center 69 of the inside portion 68 of the ring of the positional shift detection drawing pattern 67 by using, for example, the method for obtaining the center of the area, and obtains coordinate differences ($\Delta X4$, $\Delta Y4$) between both centers. Note that the center 69 of the inside portion 68 of the ring of the positional shift detection drawing pattern 67 also corresponds to the center of the positional shift detection drawing pattern 67.

Also in this case, the positional shift detection unit 47 in FIG. 5 sums the coordinate differences ($\Delta X1$, $\Delta Y1$) and ($\Delta X4$, $\Delta Y4$) and stores the total coordinate differences ($\Delta XA$, $\Delta YA$) as correction values, or the positional shift detection unit 47 may only obtain the coordinate differences ($\Delta X1$, $\Delta Y1$) and ($\Delta X4$, $\Delta Y4$) and store the respective values, and the drawing control unit 46 may sum the respective values at the time of correction.

Moreover, in the above-mentioned embodiment, each of the optical heads of the optical head unit 8 uses a DMD in which a large number of movable micromirrors are arranged in a matrix form; however, an optical head using, for example, a grating light valve (GLV: registered trademark) which is a spatial light modulation element similar to the DMD may be adopted.

Furthermore, in the above description, only the single AM 9 formed on the substrate 1 has been described; however, actually, a plurality of AMs are formed on the substrate 1. For example, in FIG. 2, another AM 12 is shown, and by detecting the plural AMs, it is possible to detect a shift in the rotation direction or the like of the substrate 1 and consequently to carry out its correction.

What is claimed is:

1. A pattern drawing apparatus, comprising:
an optical head;
a table carrying out a relative movement to the optical head and on which a workpiece is mounted;
a drawing control unit controlling a relative amount of movement between the table and the optical head based on a reading position of an alignment mark serving as a reference of drawing positions formed on the workpiece, and drawing a desired pattern on the workpiece by an irradiation light beam from the optical head;
a pattern formation unit arranged on a side of the table and on which a first pattern for detecting a positional shift is formed;
a first image-pickup device attached on a side of the optical head and capable of carrying out a relative movement to the table, the first image-pickup device reading the alignment mark and the first pattern, the first pattern including a light transmission section and a light shielding section surrounding the light transmission section;
a second image-pickup device attached on the side of the table and disposed in a fixed positional relation to the pattern formation unit and reading the first pattern and a second pattern for detecting a positional shift drawn in a visual field by carrying out the relative movement by the drawing control unit; and
a positional shift detection unit obtaining a first coordinate difference between a center of a visual field of the first image-pickup device and a center of the first pattern based on a read image by the first image-pickup device, obtaining a second coordinate difference between the center of the first pattern and a specific position of the second pattern based on a read image by the second image-pickup device, and summing the first coordinate difference and the second coordinate difference to use as a correction value of the relative amount of movement.

2. The pattern drawing apparatus according to claim 1, wherein the positional shift detection unit obtains a third coordinate difference between a center of a visual field of the second image-pickup device and the center of the first pattern based on the read image of the first pattern by the second image-pickup device as a component of the second coordinate difference, and a fourth coordinate difference between the center of the visual field of the second image-pickup device and the specific position of the second pattern based on the read image of the second pattern by the second image-pickup device as a remaining component of the second coordinate difference, and further sums the first coordinate difference, the third coordinate difference, and the fourth coordinate difference to use as the correction value.

3. The pattern drawing apparatus according to claim 1, wherein the second pattern is drawn by an optical head which forms a reference of a drawing position among the plural optical heads included therein.

4. A pattern drawing method comprising:
providing a table on which a workpiece is mounted and is allowed to carry out a relative movement to an optical head;
using a relative amount of movement between the table and the optical head based on a reading position of an alignment mark as a reference of drawing positions formed on the workpiece;
drawing a desired pattern on the workpiece by an irradiation light beam from the optical head;
reading an image of a first pattern for detecting a positional shift formed on a pattern formation unit arranged on a side of the table by a first image-pickup device attached on a side of the optical head and configured to carry out a relative movement to the table, the first image-pickup device reading the alignment mark, the first pattern including a light transmission section and a light shielding section surrounding the light transmission section;
reading the first pattern by a second image-pickup device attached on the side of the table and disposed in a fixed positional relation to the pattern formation unit;
drawing a second pattern for detecting a positional shift in a visual field of the second image-pickup device by the irradiation light beam from the optical head by allowing the table to carry out the relative movement;
reading the drawn second pattern, and obtaining a first coordinate difference between a center of a visual field of the first image-pickup device and a center of the first pattern based on a read image by the first image-pickup device in the first step obtaining a second coordinate difference between the center of the first pattern and a specific position of the second pattern based on a read image by the second image-pickup device in the second step and the fourth step, and further summing the first coordinate difference and the second coordinate difference to use as a correction value of the relative amount of movement.

5. The pattern drawing method according to claim 4, wherein the second pattern is drawn by an optical head which serves as a reference of a drawing position among the plural optical heads included therein.

6. The pattern drawing method according to claim 4, wherein the positional shift detection unit obtains a third coordinate difference between a center of a visual field of the second image-pickup device and the center of the first pattern based on the read image of the first pattern by the second image-pickup device as a component of the second coordinate difference, and obtaining a fourth coordinate difference between the center of the visual field of the second image-pickup device and the specific position of the second pattern based on the read image of the second pattern by the second image-pickup device as a remaining component of the second coordinate difference, and further sums the first coordinate difference, the third coordinate difference, and the fourth coordinate difference to use as the correction value.

\* \* \* \* \*